US005864496A

United States Patent [19]
Mueller et al.

[11] Patent Number: 5,864,496
[45] Date of Patent: Jan. 26, 1999

[54] HIGH DENSITY SEMICONDUCTOR MEMORY HAVING DIAGONAL BIT LINES AND DUAL WORD LINES

[75] Inventors: Gerhard Mueller, Wappingers; Toshiaki Kirihata, Poughkeepsie, both of N.Y.; Heinz Hoenigschmid, Starnberg, Germany

[73] Assignees: Siemens Aktiengesellschaft, Munich, Germany; International Business Machines Corporation, Armonk, N.Y.

[21] Appl. No.: 939,455

[22] Filed: Sep. 29, 1997

[51] Int. Cl.[6] .................................................. G11C 5/08
[52] U.S. Cl. ........................ 365/69; 365/63; 365/51; 257/773
[58] Field of Search .................. 365/69, 63, 51; 257/773

[56] References Cited

U.S. PATENT DOCUMENTS

| | | | |
|---|---|---|---|
| 5,107,459 | 4/1992 | Chu et al. | 365/63 |
| 5,194,752 | 3/1993 | Kumagai et al. | 365/63 |
| 5,315,542 | 5/1994 | Melzner | 365/63 |
| 5,391,901 | 2/1995 | Tanabe | 257/296 |
| 5,396,451 | 3/1995 | Ema | 365/63 |
| 5,416,734 | 5/1995 | Hidaka et al. | 365/63 |
| 5,566,104 | 10/1996 | Shinkawata | 365/63 |

FOREIGN PATENT DOCUMENTS

| | | |
|---|---|---|
| 401199465A | 8/1989 | Japan . |
| 403105969 | 5/1991 | Japan . |

OTHER PUBLICATIONS

"FA 14.6: A 1Gb DRAM for File Applications", T. Sugibayashi et al., ISSC95/Session 14.

*Primary Examiner*—David Nelms
*Assistant Examiner*—Tuan T. Nguyen
*Attorney, Agent, or Firm*—Stanton C. Braden

[57] ABSTRACT

The semiconductor memory includes a memory cell array (10) of memory cells arranged in rows and columns, and a plurality of diagonal bit lines ($BLP_1$–$BLP_N$) arranged in a pattern that changes horizontal direction along the memory cell array to facilitate access to said memory cells. The bit lines are arranged non-orthogonal to a plurality of dual word lines ($WL_1$–$WL_M$), where each dual word line includes a master word line ($MWL_i$) at a first layer and a plurality of local word lines ($LWL_1$–$LWL_X$) at a second layer. The local word lines are connected to the master word line of a common row via a plurality of spaced electrical connections (29), e.g., electrical contacts in a "stitched" architecture, and each local word line is connected to plural memory cells (MC). The electrical connections run in substantially the same pattern along the memory cell array as the bit lines.

19 Claims, 9 Drawing Sheets

FIG. 10

HIGH DENSITY SEMICONDUCTOR MEMORY HAVING DIAGONAL BIT LINES AND DUAL WORD LINES

FIELD OF THE INVENTION

This invention relates generally to semiconductor memories such as dynamic random access memories (DRAMs). More specifically, this invention relates to a space efficient architecture for a high density semiconductor memory having diagonal bit lines to facilitate memory cell access, and having dual word lines on different, vertically-spaced layers.

BACKGROUND

As the trend towards ever increasing capacity of semiconductor memories continues, new designs are necessary to conserve space on the chip without compromising performance. As smaller and smaller memory cells become feasible, the problem of effectively accessing the cells with word lines and bit lines without adding significantly to the size of the chip, becomes more challenging.

Conventional DRAM chips employ millions of memory cells arranged in one or more arrays of rows and columns, with bit lines running parallel to the columns and word lines running parallel to the rows. Each memory cell is comprised of an access transistor (e.g., an NFET) and a capacitor such as a trench capacitor for storing charge corresponding to a data bit. The memory cells are typically located at the intersections of the word lines and bit lines. The gate electrode of each access transistor is electrically connected to the associated word line while the transistor's drain terminal is connected to the associated bit line.

In what is known as a folded-bit line architecture, "true" memory cells are located in close proximity to corresponding complementary memory cells. The true cells are connected to true bit lines and the complementary cells are connected to complementary bit lines. A true bit line and an adjacent complementary bit line form a bit line pair. The bit line pair is typically connected at one end to a sense amplifier. The term "column" is sometimes used herein to refer to a bit line pair.

Prior to reading data from a true cell, the true and complementary bit lines are precharged with a certain precharge voltage, and then left floating at that voltage. To read from the true cell, the access transistor is switched on, thereby modifying the voltage level on the true bit line due to charge sharing with the memory cell capacitor. The voltage on the complementary bit line remains at the precharge voltage, whereby a differential voltage is applied to the sense amplifier. The sense amplifier then amplifies the differential voltage to provide a solid logic level for readout and restore operations. Similarly, to read from a complementary cell, the true bit line is held at the precharge voltage while the word line coupled to the complementary cell is raised, whereby an analogous differential voltage is amplified by the sense amplifier.

A word line configuration designed to reduce memory cell access time (RC time constant of the word line) is referred to herein as a dual word line configuration. A dual word line consists of a master word line running continuously across the entire memory cell array or subarray, and a number of local word lines, either connected to or separated from each other, each electrically connecting a predetermined number of memory cells in an associated row to one master word line. One master word line and multiple local word lines are used for each row of the array. Each master word line overlies the associated local word lines on a different vertically-spaced layer, with a suitable dielectric layer separating the two layers. The master word line is composed of a low resistivity metal such as aluminum whereas the local word lines are typically composed of highly doped polysilicon with a silicide layer on top. In what is referred to as a "stitched" architecture, the local word lines are electrically connected to the associated master word line by means of periodic electrical via hole contacts (stitches) between the layers. In what is known as a "segmented" dual word line architecture, word line drivers employing FET switches are used in place of the via hole contacts. With either approach, the total resistance in the path to any given memory cell is substantially reduced. With lower word line resistance, the RC time constant associated with each word line is reduced, thereby reducing memory cell access time. The segmented architecture has the additional advantage of reduced word line capacitance; however, a drawback to this configuration is the additional complexity and space required for the local word line drivers.

Recently, a high density DRAM referred to as a "diagonal bit line (DBL)" DRAM has been developed. With the DBL-type DRAM, the effective cell size is nearly $6F^2$, where F is the minimum feature size of the processing technology. An example of a diagonal bit line type DRAM is disclosed in an article entitled "FA 14.6: A 1 Gb DRAM for File Applications", by T. Sugibayashi et al., ISSC95/ Session 14. That article discloses a DRAM using an open bit line architecture. The open bit line architecture, however, is more susceptible to noise-related problems than a folded bit line architecture.

Figure 1A:
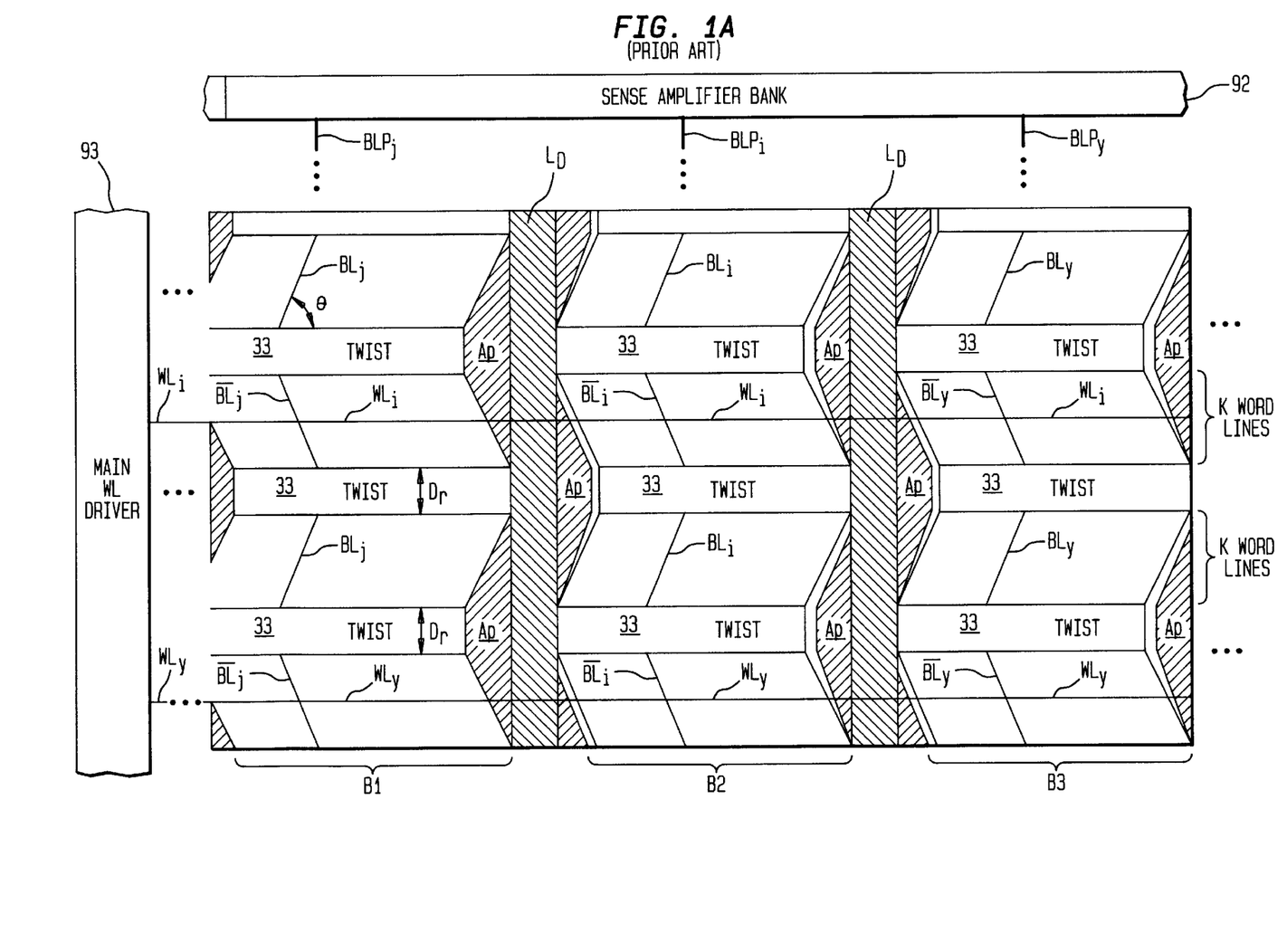
FIG. 1A illustrates a layout of a prior art diagonal bit line type memory employing segmented word lines.
Figure 1B:
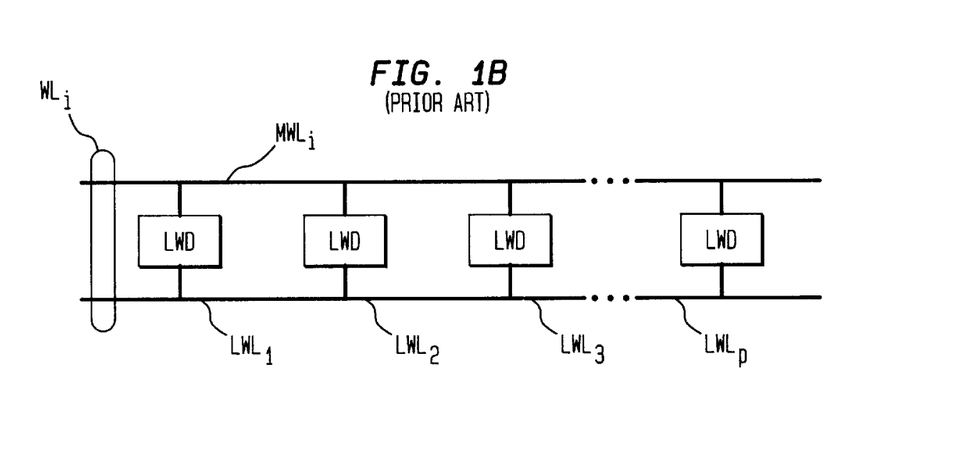
FIG. 1B shows a simplified segmented word line arrangement.

Referring to FIG. 1A, there is shown a portion of a diagonal bit line type DRAM employing segmented dual word lines and folded bit lines. Each memory array in the DRAM is divided into multiple memory blocks such as B1, B2 and B3. Dual word lines such as $WL_i$ or $WL_y$ extend across multiple blocks and are driven by a main word line driver 93. Local word line drivers are disposed in areas $L_D$ between the blocks. As shown in FIG. 1B, each dual word line as $WL_i$ consists of a master word line $MWL_i$ and a number P of local word lines $LWL_1$–$LWL_p$. A local word line driver LWD is coupled between each local word line and the master word line. Each local word line driver operates to drive the associated local word line to permit selective access to the cells coupled to that local word line.

Figure 2:
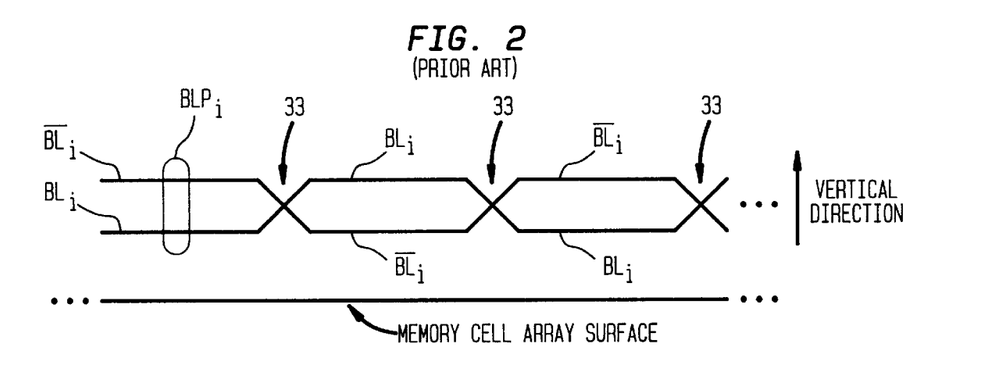
FIG. 2 illustrates a bit line configuration in the vertical plane.

Folded bit line pairs such as $BLP_j$, $BLP_i$, $BLP_y$ are each coupled to a respective sense amplifier within sense amplifier bank 92. Each pair as $BLP_j$ consists of a true bit line $BL_j$ and a complementary bit line $/BL_j$. The bit lines run diagonally with respect to the word lines, changing direction at twist regions 33. Direction changes occur every K word lines, where K is typically $2^N$, e.g., eight, sixteen, thirty-two, sixty-four, etc. As shown in FIG. 2, the true and complementary bit lines of each bit line pair are vertically spaced from one another, alternatingly overlying and underlying one another. At each twist region 33, a three dimensional twist occurs such that the vertical positions of the true and complementary bitlines change with respect to one another. This three dimensional twist will be referred to herein as a vertical twist. At twist regions 33, a change in horizontal direction can also occur. In this case, the bit lines define zigzag-type patterns in the horizontal plane along the memory array.

An example of a memory cell array employing diagonal bit line cells and vertical twists for the bit lines is disclosed in co-pending U.S. patent application Ser. No. 08/884,853, attorney docket numbers 96E9190US and FI8960449, by John DeBrosse et al., filed Jun. 30, 1997, assigned to the assignee herein and incorporated herein by reference in its entirety (hereafter, the DeBrosse et al. application).

In the architecture of FIG. 1A, the zigzag patterns of the bit lines, in conjunction with the locations of the local word line drivers between memory blocks, results in wasted chip area in the regions $A_p$ at the edge of each memory block. The area penalty is a function of the bit line slant angle $\Theta$ of the pattern and the length $D_T$ of the vertical twist regions.

Accordingly, for high density memories employing diagonal bit lines, there is a need for an improved architecture in which the above-described area penalty is reduced or substantially eliminated, such that a smaller chip size for a given memory capacity can be realized.

SUMMARY OF THE INVENTION

The present invention is directed towards a high density semiconductor memory having diagonal bit lines and a dual word line configuration with highly efficient use of chip area. In an exemplary embodiment, the semiconductor memory includes a memory cell array of memory cells arranged in rows and columns, and a plurality of diagonal bit lines arranged in a pattern that changes horizontal direction along the memory cell array to facilitate access to the memory cells. The bit lines are arranged non-orthogonal to a plurality of dual word lines, where each dual word line includes a master word line at a first layer and a plurality of local word lines at a second layer. The local word lines each connect to plural memory cells and to the master word line of a common row via a plurality of spaced electrical connections. The electrical connections, which may be, e.g., electrical contacts, run in substantially the same pattern in the horizontal plane along the memory cell array as the bit lines. The bit lines may be arranged in folded or open configurations. Advantageously, the substantial area penalty exhibited by prior art diagonal bit line type memories of the segmented word line type, is largely eliminated with the present invention.

DETAILED DESCRIPTION OF PREFERRED EMBODIMENTS

The present invention relates to a space-efficient, high density semiconductor memory employing diagonal bit lines and dual word lines with a space efficient architecture. The invention provides a way to substantially eliminate the area penalty associated with diagonal bit line type memories. For purposes of discussion, an exemplary embodiment of the invention is described in the context of a DRAM chip. The invention however has broader applications. Merely by way of example, the invention has application in other memory devices such as EDO-DRAM, SDRAM, RAMBUS-DRAM, MDRAM, SRAM, flash RAM, EPROM, EEPROM, or mask ROM, or merged DRAM-logic (embedded DRAM). The devices are used in, for example, consumer products such as computer systems, cellular phones, personal digital assistants (PDAs), and other electronic products.

Figure 3:
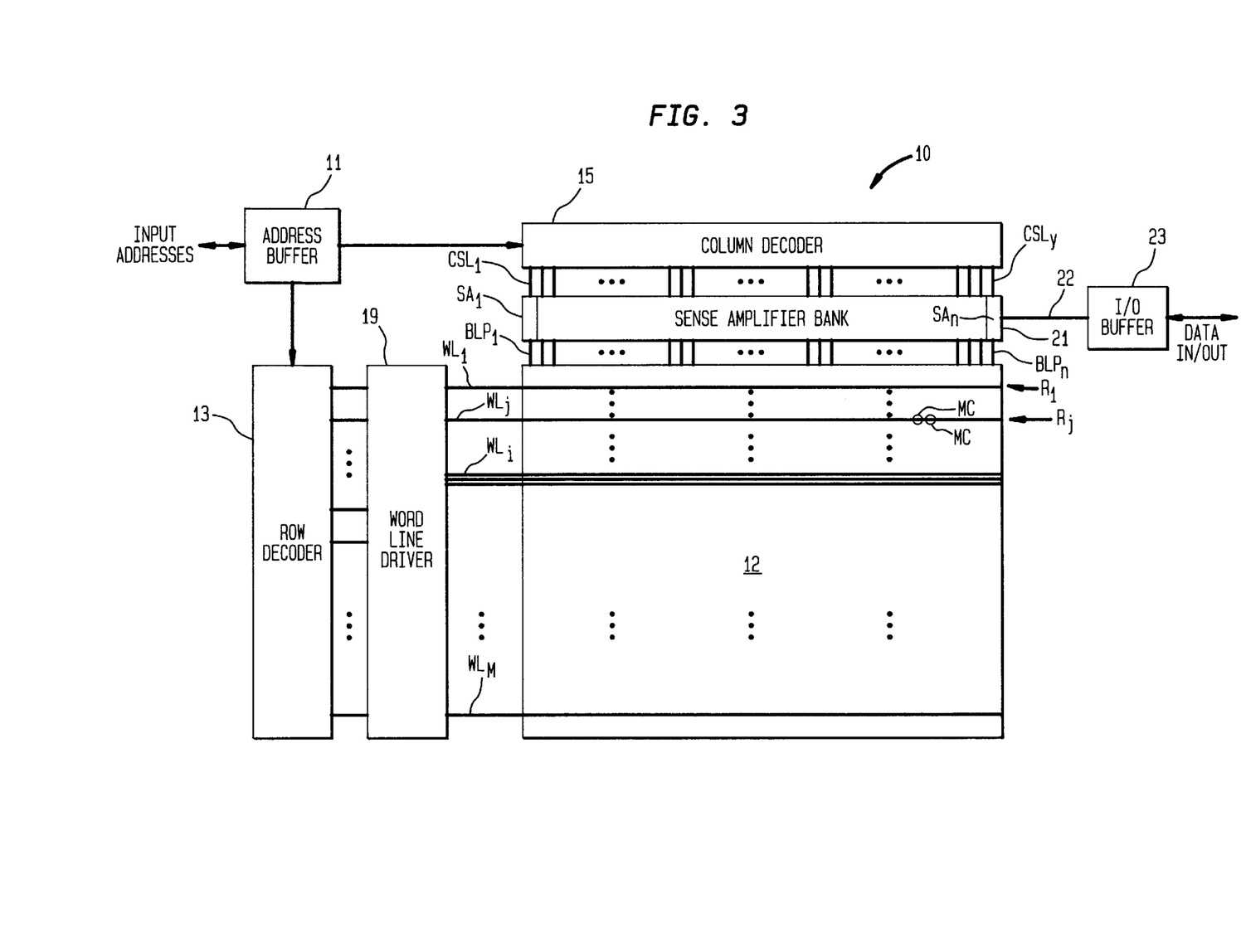
FIG. 3 is a schematic block diagram of an exemplary DRAM of the present invention.
Figure 11:
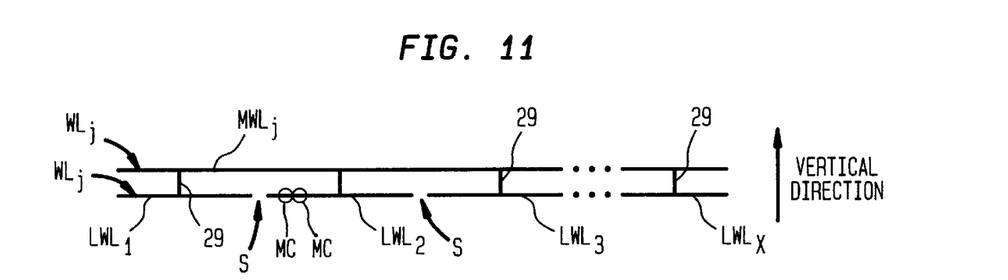
FIG. 11 illustrates a stitched dual word line configuration used within embodiments of the present invention.

With reference now to FIG. 3, there is shown a simplified schematic block diagram of an embodiment of the present invention, designated as DRAM 10. A memory cell array 12 of DRAM 10 comprises of memory cells MC arranged in an array of M rows by N columns. By way of example, M and N may each be on the order of several thousand or tens of thousands. Each one of M dual word lines $WL_1$ to $WL_M$ is electrically coupled to memory cells MC of an associated row such as $R_j$. FIG. 11 schematically illustrates one of the dual word lines $WL_j$ in the vertical plane (where the major surface of the memory cell array is defined as being in the horizontal plane). Dual word line $WL_j$ consists of a master word line $MWL_j$ and X local word lines $LWL_1$–$LWL_X$ oriented along the associated row. The master word lines and local word lines are fabricated on different, vertically spaced layers, and each master word line overlies the associated local word lines in the respective row. Each local word line is electrically connected to the associated master word line by an electrical contact (stitch) 29. This type of arrangement is known as a stitched dual word line architecture, mentioned above. The local word lines $LWL_1$–$LWL_X$ of any given row are preferably formed as a continuous line along the array, but may alternatively be separated by spacings S as shown.

With continuing reference to FIG. 3, incoming addresses to DRAM 10 are applied to an address buffer 11 which in turn provides the addresses to a row decoder 13 and a column decoder 15 as is conventional. Row decoder 13 operates in conjunction with a word line driver 19 to activate the master word line corresponding to the row of the incoming address. Likewise, column decoder 15 activates one of column select lines $CSL_1$ to $CSL_y$ corresponding to the column of the incoming address, whereby data can be written into or read from the particular memory cell corresponding to the row and column of the address. A sense amplifier bank 21 includes N sense amplifiers $SA_1$–$SA_N$, one for each column, each of which is coupled to a corresponding bit line pair $BLP_1$–$BLP_N$. A master data line 22 connects to each sense amplifier in the bank and carries data to or from the target memory cell at any given time. Input/output (I/O) buffer 23 connects to data line 22, and buffers incoming and outgoing data in a conventional manner.

Figure 4:
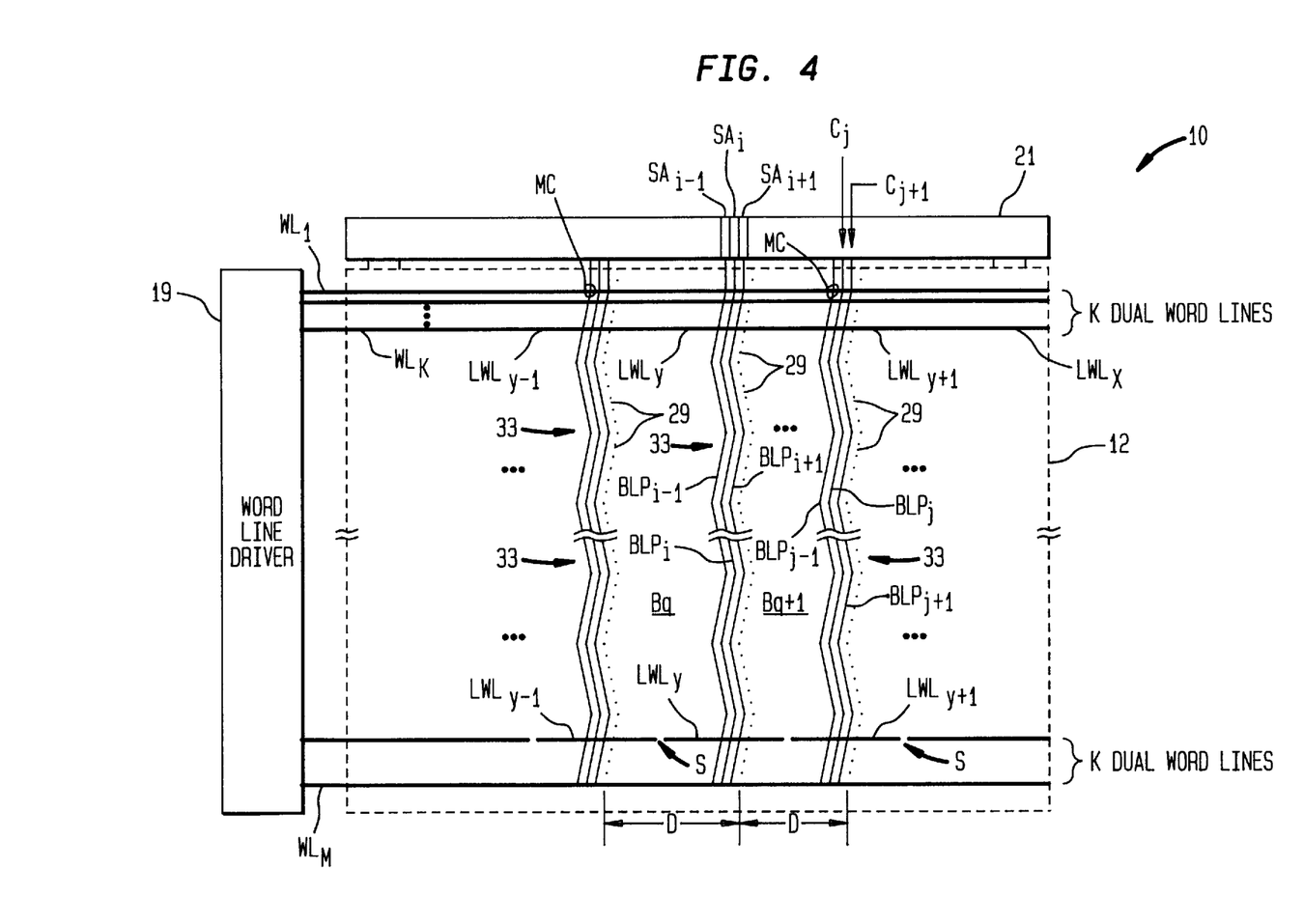
FIG. 4 schematically illustrates a portion of the DRAM of FIG. 3.

With reference to FIG. 4, the layout of several bit lines of DRAM 10 in the horizontal plane is illustrated. The bit lines employed in the present invention are diagonal bit lines conducive to accessing small memory cells such as $6F^2$ cells. The memory cells may be conventional diagonal bit line cells similar to those disclosed in the T. Sugibayashi et al. article cited hereinabove. In FIG. 4 herein, the bit lines are shown as folded bit lines, where a bit line pair, such as $BLP_j$, comprises true and complementary diagonal bit lines $BL_j$, $\overline{BL_j}$ as was the case for the bit lines of FIGS. 1A and 2 described above. However, it is understood that the present invention is applicable to both a folded bit line architecture and to an open bit line architecture. The open line architecture will be discussed further below.

For the folded bit line architecture of FIG. 4, each bit line pair as $BLP_j$ may be the same as that shown in FIG. 2. Each pair comprises of a true bit line $BL_j$ electrically connected to the true memory cells MC in column $C_j$, and a complementary bit line $\overline{BL_j}$ connected to the complementary cells in column $C_j$. The true and complementary bit lines are aligned with one another in the vertical plane (where the major surface of the memory cell array is in the horizontal plane). The true bit lines are periodically twisted at locations 33 in the vertical plane with the associated complementary bit lines as was discussed earlier. As such, the true bit line alternately overlies and underlies the associated complementary bit line, where the two lines are vertically spaced by a dielectric layer. That is, alternating portions of the true bit line run on top of the complementary bit line, and vice versa. The twists occur after every K word lines, where K is preferably $2^N$, e.g., eight, sixteen, thirty-two sixty-four, etc.

In the horizontal plane, each bit line pair runs in a zigzag-type pattern as was described above in reference to FIG. 1A. The slanted direction (i.e., slanted with respect to the word lines) of the zigzag pattern changes at every twist of the true and complementary bit lines, i.e. at locations 33.

In accordance with the present invention, the electrical contacts or stitches 29 that connect the local word lines to the associated master word line follow the same zigzag pattern in the horizontal plane as the bit lines. Accordingly, the above-described area penalty of the segmented architecture of FIG. 1A is largely eliminated. That is, unused area "$A_p$" of FIG. 1A is substantially reduced to zero. The only additional area of the memory cell array which is required to implement the stitched architecture of the present invention is the area occupied by the stitches themselves, e.g., three microns per stitch (including the area of dummy bit lines on both sides of each stitch 29 as necessary). The memory cell area in between each zigzag pattern of stitches 29 defines a memory cell block such as Bq, analogous to the memory blocks B1–B3 of FIG. 1A. Adjacent memory cell blocks such as Bq and Bq+1 "fit" together in a space efficient manner. In any given row, the stitches 29 of adjacent local word lines as $LWL_y$, $LWL_{y+1}$ are separated by a distance D, where D is dependent on the number of memory cells allocated to each local word line, and the dimensions of each memory cell. By way of example, if subarray 12 utilizes eight memory blocks B1 to B8 (side by side in the row direction), there would be eight zigzag patterns of stitches. Then, for three micron stitches, the area consumed by the stitches would be 24 microns times the column length of subarray 12.

It is noted that for other folded bit line embodiments, the regions where changes in horizontal direction of the bit lines occur are not coincident with the vertical twist regions of the bit lines. Thus, for example, in some embodiments, the changes in horizontal direction would occur at the regions 33 as shown in FIG. 4, but the vertical twists would occur somewhere in between the shown regions 33.

Figure 5:
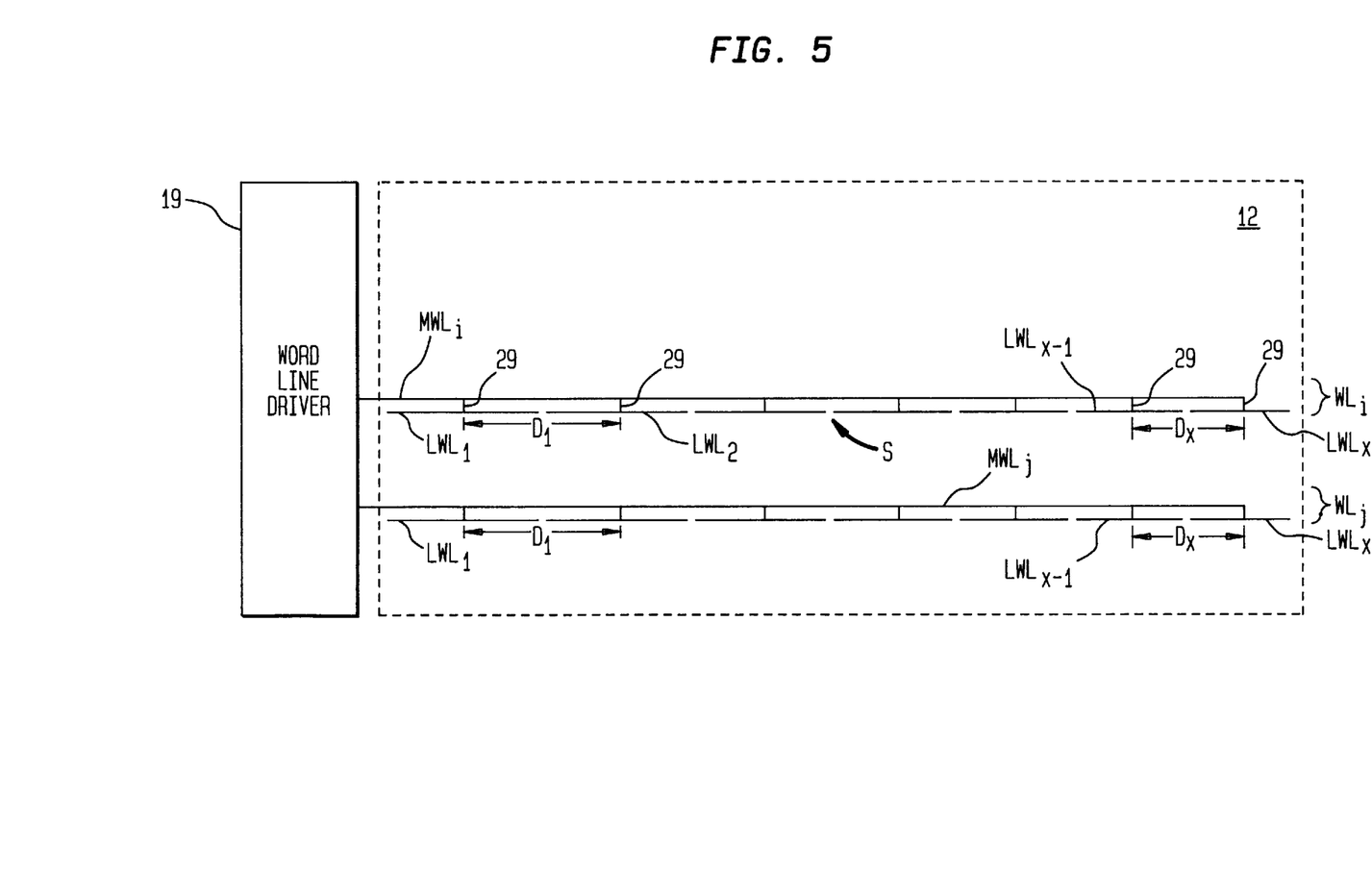
FIG. 5 illustrates an exemplary local word line arrangement.

The distance D between adjacent local word lines may be different for different portions of each row. For example, it is preferable to allocate a lower number of memory cells to the local word lines further away from the word line driver than for those closer to the word line driver, whereby the distance D becomes progressively smaller as the row extends away from the word line driver. This approach is illustrated in FIG. 5. The distance D1 between the stitch 29 of the first local word line $LWL_1$ to the stitch 29 of $LWL_2$ is substantially greater than the distance DX between the next to last if local word line $LWL_{X-1}$ and the last local word line $LWL_X$ of each row. It is noted that each stitch 29 preferably connects the master word line to the center of each associated local word line. The approach of FIG. 5 allows for a reduction in the total number of stitches in each row, since, as compared to the case in which uniform local word line spacings are used, a larger number of memory cells can be allocated to the local word lines closer to the word line driver. By way of example, there may be about 500 memory cells connected to $LWL_1$ and about 300 to $LWL_X$. The irregular spacing approach is feasible because the limiting factor in the local word line lengths is the delay time from the word line driver to the last memory cell of each local word line. If uniform spacings are used, the delay times are shorter for the memory cells closest to the word line driver, whereas if irregular spacings are used, the delay times of all cells may be approximately equalized.

It is also noted that the local word lines may be separated from one another by a distance S as shown. As an alternative, all the local word lines may be formed as one continuous, electrically conductive line, whereby S is zero. Preferably, the latter approach is taken, with the local word lines being formed integrally with the gate electrodes of all the memory cells (true or complementary) in the row.

Figure 6:
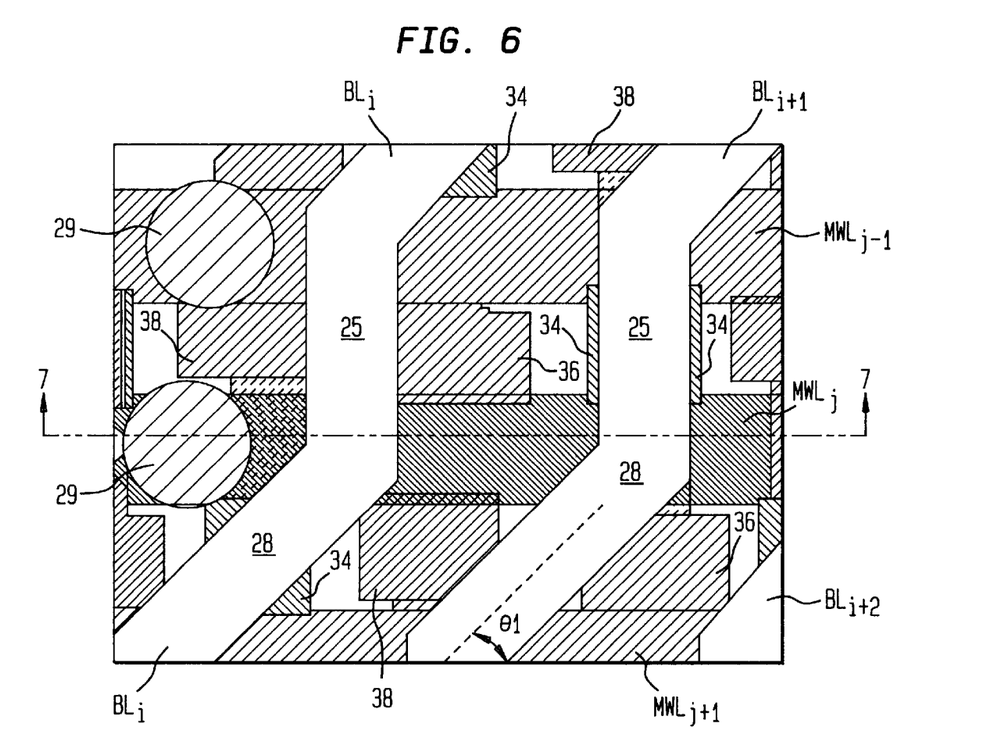
FIG. 6 is a plan view of a portion of the DRAM corresponding to a single memory cell area.
Figure 7:
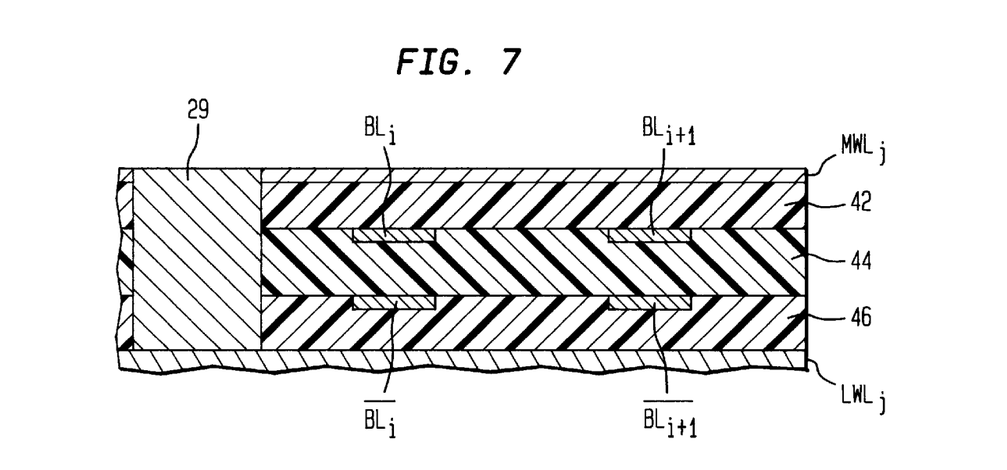
FIG. 7 is a sectional view taken along the lines 7—7 of FIG. 6.

With reference now to FIG. 6, there is shown a plan view of a portion of the memory cell array 12 corresponding to approximately two memory cell areas. FIG. 7 is the cross-sectional view taken along the lines 7—7 of FIG. 6. Referring to FIGS. 6 and 7, it is seen that a true bit line as $BL_i$ directly overlies a complementary bit line $/BL_i$. As discussed above, in other portions of the memory array, the complementary bit line overlies the true bit line. The bit lines are separated by a dielectric layer 44 such as silicon dioxide. A typical thickness for layer 44 is about 400 nanometers and an exemplary width for each bit line is about the minimum feature size F, e.g., 0.25 um (for 0.25 micron technology). As an example, each bit line is comprised of portions 25 which are orthogonal to the word lines such as $MWL_j$, $MWL_{j+1}$, and portions 28 that are slanted with respect to the word lines. (In FIG. 6, the regions of the master word lines $MWL_j$, $MWL_{j-1}$ overlapping the bit lines are removed for clarity). An exemplary angle $\Theta 1$ of portion 28 with respect to the word lines is about 45°. For certain diagonal cell designs, the portions 25 orthogonal to the word lines can be eliminated, whereby the bit lines run diagonally in a continuous fashion for each segment of K word lines.

Electrical contacts or stitches 29 are shown adjacent bit line $BL_i$ and extend, as shown in FIG. 7, from the master word line as $MWL_j$ to the associated local word line $LWL_j$, the latter of which is preferably integrated with the gate conductors of the transistors in the row. The master word line as $MWL_j$ is separated from the top bit lines by another dielectric layer 42. A dielectric layer 46 separates the lower bit lines from the local word lines. Also shown in FIG. 6 are interconnects 34 for interconnecting bit lines to the drains of the associated memory cell transistors, and trench capacitor regions 36 and 38 of respective memory cells. Suitable metallization such as aluminum, is used to form the stitches 29. The diameter of stitches 29 is approximately the width of a bitline, e.g., 0.25 um. However, the area that needs to be allocated for the stitch region is larger, e.g. 1–5 um, because one or two dummy bit lines on both sides of each stitch are typically necessary. Thus, the area occupied by the dummy bit lines is significantly larger than the stitch itself.

Figure 8:
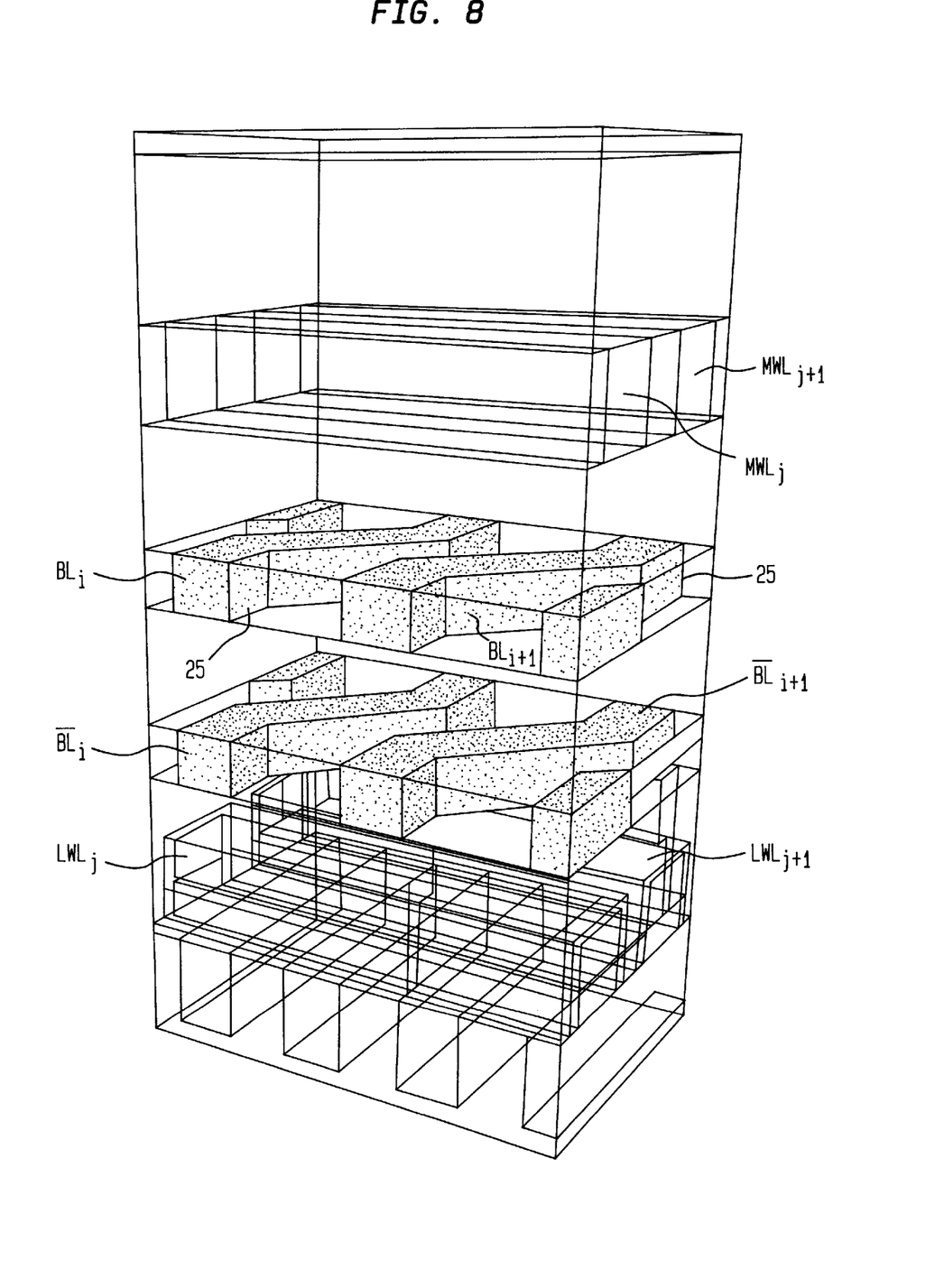
FIG. 8 is a perspective view of a three dimensional section of the memory array of FIG. 3.

Referring to FIG. 8, a perspective view of a three dimensional section of memory array 12 is shown. The section corresponds to approximately three memory cells of the array. The reference numerals depicted in FIG. 8 correspond to those in FIGS. 6 and 7.

Figure 9:
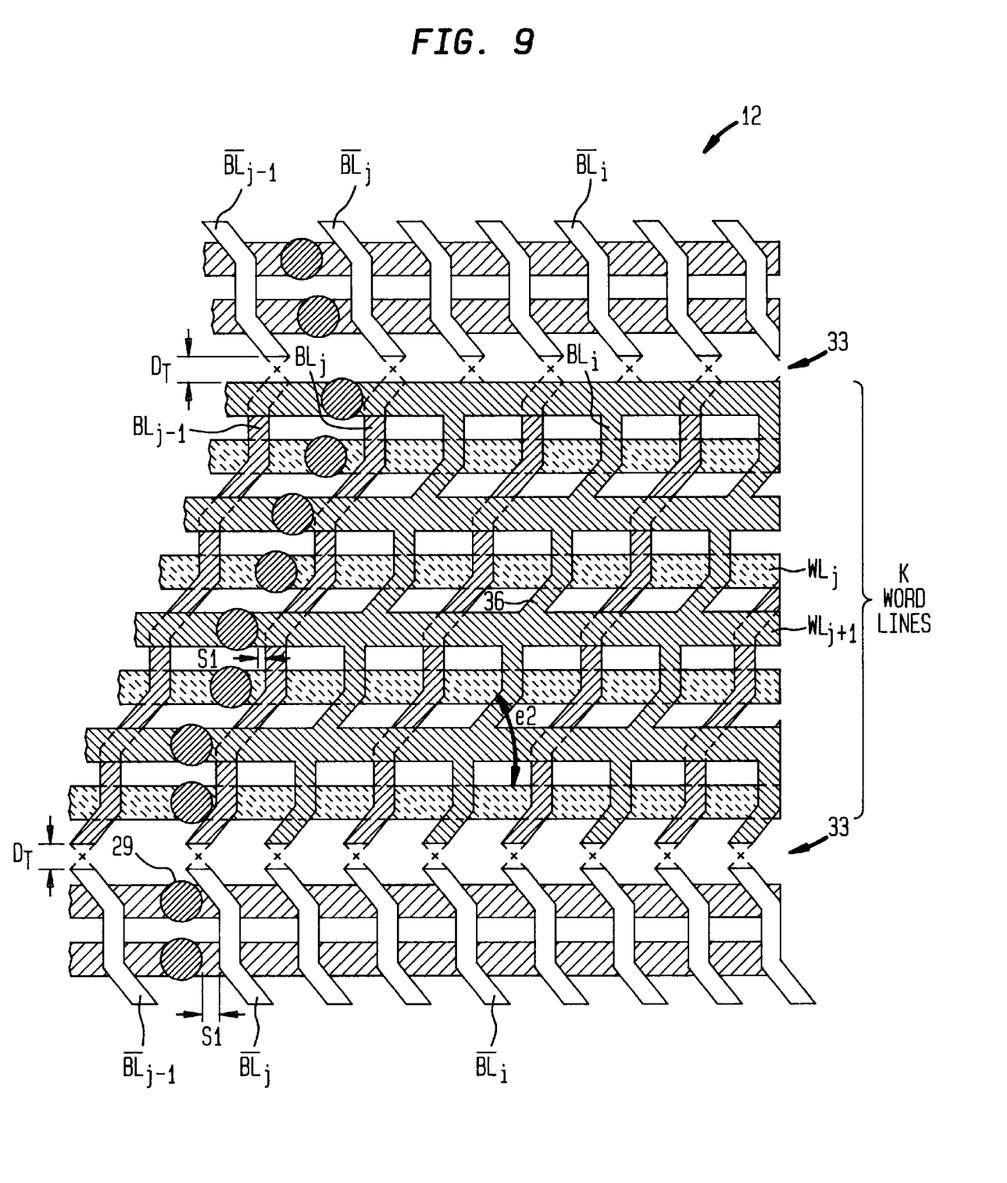
FIGS. 9 and 10 are plan views illustrating a layout of bit lines and word lines of a DRAM in accordance with the invention.

Turning now to FIG. 9, there is shown a plan view of a portion of an exemplary layout of memory cell array 12 showing only bit lines, word lines and stitches 29. At regions 33, the bit line pairs are vertically twisted to facilitate access to the memory cells. For example, in the central portion of the figure, the true bit lines as BLi run on top of complementary bit lines and the complementary bit lines access the memory cells in that portion. Thus, for the K consecutive rows in the central portion of the figure, only the complementary bit lines are connected to the memory cells. As mentioned above, K is preferably $2^N$, e.g., eight, sixteen, thirty-two, sixty-four, etc. A vertical twist occurs at the lower and upper junctures 33, whereby the complementary bit lines such as $/BL_j$ then run on top of the true bit lines as BLi. Thus, in the portions directly below the lower region 33 and directly above the upper region 33, the complementary bit lines overlie the true bit lines, and the true bit lines access the true memory cells for K consecutive word lines. The configuration of the vertical twist regions 33 may be similar to or essentially the same as that disclosed in the DeBrosse et al. patent application mentioned above. The horizontal distance $D_T$ of each vertical twist region 33 is typically on the order of three microns.

In addition to the vertical twist occurring at each region 33, the zigzag pattern changes direction for the embodiments shown herein. The slant angle $\Theta 2$ between the dotted line 36 and the direction of the word lines is generally the slant angle of the overall zigzag pattern. A typical slant angle $\Theta 2$ is on the order of 65°.

The electrical contacts 29 are laid out in generally the same zigzag pattern as the bit lines. In the embodiment of FIG. 9, each contact 29 is spaced at approximately the same distance S1 from the adjacent bit line in the row. The bit lines on both sides of each stitch 29, such as $BL_j$ and $BL_{j-1}$ are actually dummy bit lines as discussed above.

Figure 10:
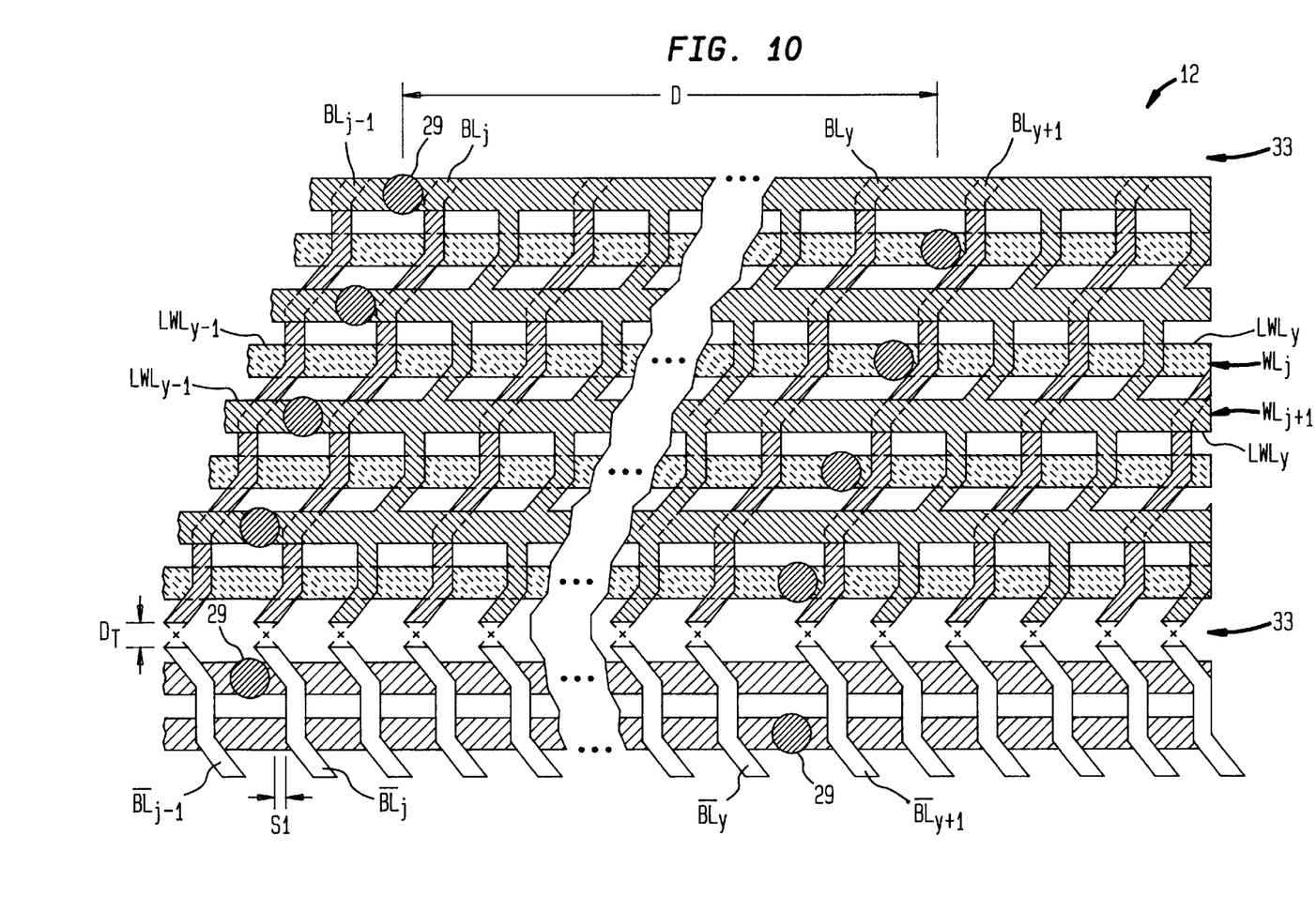

Referring to FIG. 10, the above-described exemplary layout of FIG. 9 is shown over a larger number of columns. In FIG. 10, however, the stitches 29 are arranged in an interleaved configuration such that the local word lines such as $LWL_{y-1}$ and $LWL_y$ are in a row to row staggered configuration. As mentioned above, the distance D between adjacent contacts 29 of a common row is dependent upon the number of memory cells allocated to the local word line.

While the above discussion has focused on the layout of a single memory cell array of DRAM 10, it is understood that DRAM 10 is typically a multi-array DRAM having several subarrays of memory cells. Each subarray may be essentially identical to the above-described array 12, with folded bit lines running in a zigzag pattern, with the electrical contacts 29 generally following the pattern of the bit lines, and so forth.

As mentioned above, the invention is applicable to both a folded bit line architecture and to an open bit line architecture. For example, FIG. 4 may be envisioned as one half of an open bit line architecture, with the bit lines designated such as $BLP_i$ representing a single bit line rather than a bit line pair. Thus, the other side of the open bit line architecture would reside atop the sense amplifier bank 21 of FIG. 4. In addition, the layout of the open bit line architecture would correspond to that of FIGS. 9 or 10, except that at regions 33, there would be no vertical twists—the bit lines would only undergo a change in horizontal direction. Hence, the plan view would represent only the singular bit lines of the open bit line configuration rather than alternating true and complementary bit lines.

In addition, while the sense amplifiers of the folded bit line configurations described above have been shown in unshared configurations, it is understood that they may be in shared configurations with memory cell arrays on either side, and with bit line pairs coupled to the sense amplifiers on either side. The shared configuration is advantageous in terms of space efficiency, since less space consuming sense amplifiers are employed for a given memory capacity.

While the above description contains many specifics, these specifics should not be construed as limitations on the scope of the invention, but merely as exemplifications of preferred embodiments thereof. For example, while the electrical connections between the local word lines and the corresponding master word lines have been described as being electrical contacts between vertical layers, they may alternatively be embodied as transistor switches in a "segmented" architecture. In this case, the switches would be laid out in zigzag-type patterns along the memory cell array, analogous to the way the electrical contacts are laid out in the embodiments described above. Those skilled in the art will envision many possible variations that are within the scope of the invention as defined by the appended claims.

What is claimed is:

1. A semiconductor memory, comprising:
   a memory cell array of memory cells arranged in rows and columns;
   a plurality of diagonal bit lines arranged in a pattern that changes horizontal direction along said memory cell array to facilitate access to said memory cells;
   a plurality of dual word lines non-orthogonal to the bit lines, wherein a dual word line includes a master word line at a first layer and a plurality of local word lines at a second layer, the local word lines being connected to the master word line of a common row via a plurality of spaced electrical connections, each local word line being connected to plural memory cells;
   wherein said electrical connections run in substantially said pattern having changes in horizontal direction along the memory cell array.

2. The semiconductor memory of claim 1 wherein said electrical connections are electrical contacts between said first and second layers.

3. The semiconductor memory of claim 1 wherein said bit lines are folded bit lines.

4. The semiconductor memory of claim 3, wherein a vertical twist in the folded bit lines occurs at each region of the semiconductor memory where a change in horizontal direction of the bit line pattern occurs.

5. The semiconductor memory of claim 1 wherein said bit lines are arranged in an open bit line configuration.

6. The semiconductor memory of claim 1, wherein said memory cells are substantially $6F^2$ cells where F represents the minimum feature size of memory elements.

7. The semiconductor memory of claim 1 wherein said electrical connections are arranged in an interleaved configuration in alternating rows.

8. The semiconductor memory of claim 1 wherein distances between adjacent electrical connections of a common row vary along any given row to substantially equalize delay times in accessing memory cells along the row.

9. The semiconductor memory of claim 1 wherein said pattern having changes in horizontal direction is a zigzag-type pattern.

10. The semiconductor memory of claim 1 wherein said memory comprises a dynamic random access memory.

11. A semiconductor memory, comprising:

a memory cell array having a major surface in a first plane;

a plurality of bit line pairs, wherein a bit line comprises a true bit line coupled to a plurality of true memory cells and an associated complementary bit line coupled to a plurality of complementary memory cells, the true bit line being periodically twisted with the associated complementary bit line such that the true bit line alternately overlies and underlies the complementary bit line in a second plane orthogonal to the first plane, to facilitate electrical connection to the memory cells;

a plurality of dual word lines non-orthogonal to the bit lines, wherein a dual word line includes a master word line at a first layer and a plurality of local word lines at a second layer, the local word lines being connected to the master word line of a common row via a plurality of spaced electrical connections, each local word line being connected to plural memory cells;

wherein the plurality of bit line pairs run in substantially a zigzag-type pattern along the memory cell array in the first plane with respect to said dual word lines and said electrical connections run in substantially said zigzag-type pattern along the memory cell array.

12. The memory of claim 11 wherein said electrical connections comprise electrical contacts between said first and second layers.

13. The memory of claim 11 wherein said bit line pairs generally run in alternating first and second slanted directions of said zigzag-type pattern with respect to the word lines, and the bit lines being twisted in three dimensions at portions of the pattern where a change in horizontal direction occurs.

14. The memory of claim 11 wherein said local word lines of a common row are separated from one another.

15. The memory of claim 11 wherein said local word lines of a common row are electrically continuous.

16. The memory of claim 11 wherein each bit line comprises a plurality of first portions and second portions, said first portions oriented in a direction orthogonal to said word lines and said second portions oriented at a first angle with respect to said word lines, wherein said first and second portions define said zigzag-type pattern running at a second angle with respect to said word lines.

17. The memory of claim 11 wherein said memory comprises a dynamic random access memory.

18. The memory of claim 11 wherein each memory cell occupies an area of about $6F^2$ where F is the minimum feature size of memory elements.

19. The memory of claim 11 further comprising dummy bit lines on both sides of individual ones of said stitches.

* * * * *